United States Patent [19]
Shigihara et al.

[11] Patent Number: 5,247,203
[45] Date of Patent: Sep. 21, 1993

[54] SEMICONDUCTOR DEVICE MOUNTED ON A HEAT SINK WITH AN INTERVENING AMORPHOUS SEMICONDUCTOR MATERIAL

[75] Inventors: Kimio Shigihara; Yutaka Nagai; Toshitaka Aoyagi, all of Itami, Japan

[73] Assignee: Mitsubishi Denki Kabushiki Kaisha, Tokyo, Japan

[21] Appl. No.: 649,062

[22] Filed: Feb. 1, 1991

[30] Foreign Application Priority Data

Jun. 5, 1990 [JP] Japan .................. 2-147761

[51] Int. Cl.$^5$ ........................................... H01L 23/02
[52] U.S. Cl. .................................. 257/713; 257/729; 257/717; 361/705
[58] Field of Search ............... 357/81, 74, 16; 428/209; 257/717, 713, 729, 712; 361/387, 388, 389

[56] References Cited

U.S. PATENT DOCUMENTS

| | | | |
|---|---|---|---|
| 4,698,662 | 10/1987 | Young et al. | 357/81 |
| 4,861,426 | 8/1989 | Paolella | 357/81 |
| 4,914,668 | 4/1990 | Nagai et al. | 357/81 |
| 4,947,238 | 8/1990 | Ishii et al. | 357/71 |
| 5,031,029 | 7/1991 | Acocella | 357/71 |
| 5,134,018 | 7/1992 | Tokunaga | 357/81 |

FOREIGN PATENT DOCUMENTS

8801437 2/1988 PCT Int'l Appl.

OTHER PUBLICATIONS

Davey et al., "Heat Sinks For GaAs Integrated Circuits By Heterostructures", Navy Technical Disclosure Bulletin, vol. 7, No. 3, Mar. 1982, pp. 25-29.

Comerford, "Flip-Chip Bonding By Solder Filling of Capillaries", IBM Technical Disclosure Bulletin, vol. 23, No. 5, Oct. 1980, pp. 2146-2147.

Seiwa et al., "High Power CW . . . Junction Down Mounting", Journal of Applied Physics, vol. 61, No. 1, 1987, pp. 440-442.

"Mitsubishi Denki GIHO", vol. 60, No. 12, 1986, pp. 27-31.

*Primary Examiner*—William Mintel
*Assistant Examiner*—Roy Potter
*Attorney, Agent, or Firm*—Leydig, Voit & Mayer

[57] ABSTRACT

A semiconductor device having a semiconductor element and a heat sink radiating heat generated by the semiconductor element includes an amorphous semiconductor film disposed on the heat sink and the semiconductor element disposed on the amorphous semiconductor film. Therefore, the stress applied to the semiconductor element is reduced because of the amorphous semiconductor film. In one structure, an amorphous semiconductor film comprising amorphous silicon or amorphous germanium is sandwiched between first and second metal films and the semiconductor element is bonded to the second metal film. An ohmic contact is made by alloys formed between the amorphous semiconductor film and the first and second metal films.

16 Claims, 14 Drawing Sheets

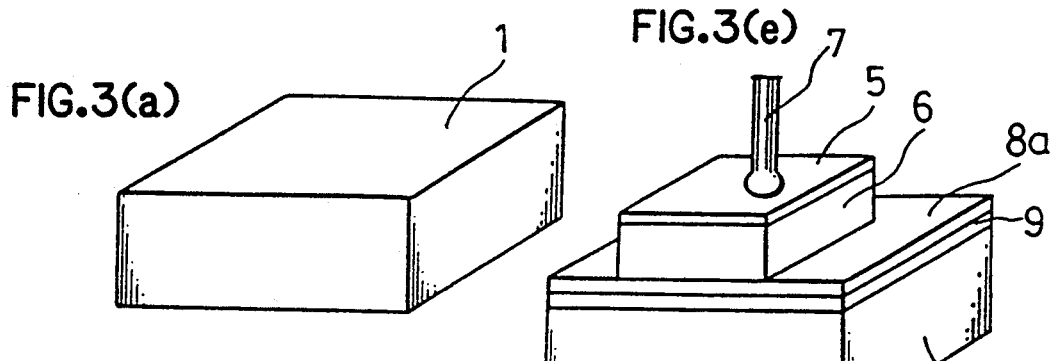
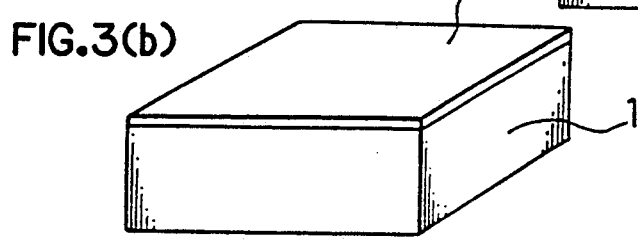
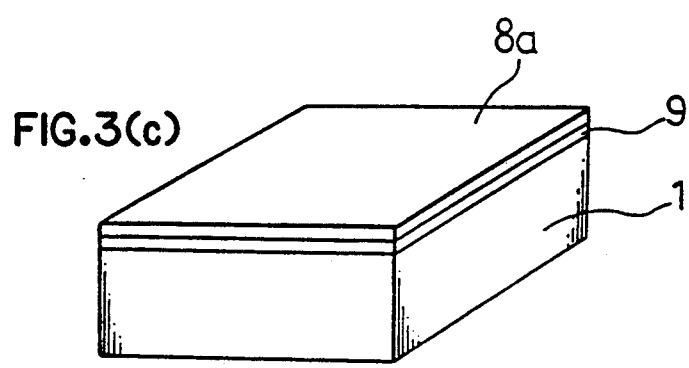
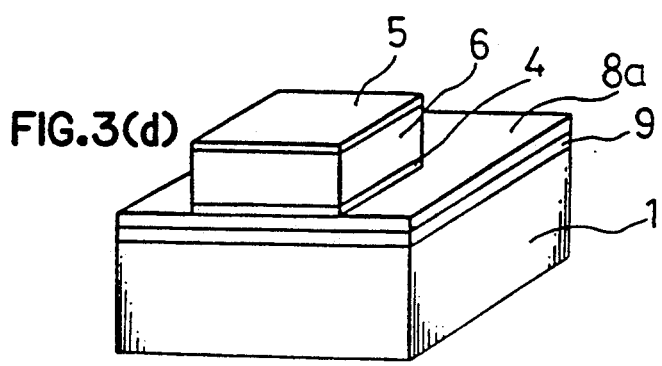

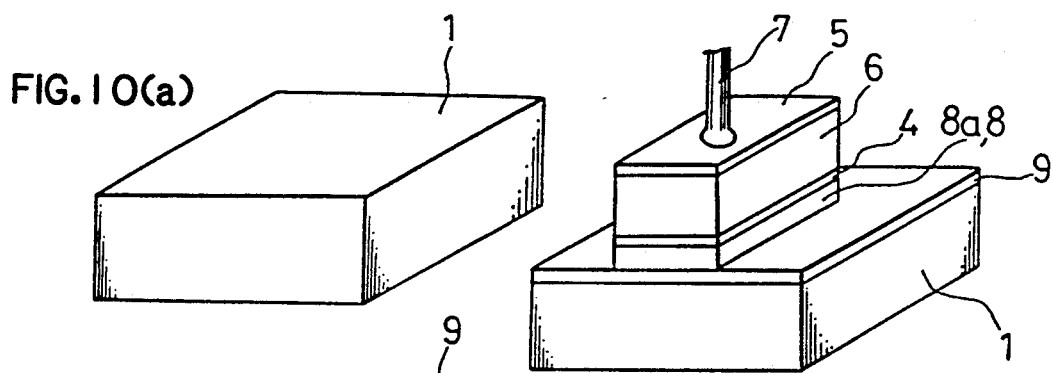
FIG. 10(e)
FIG. 10(a)
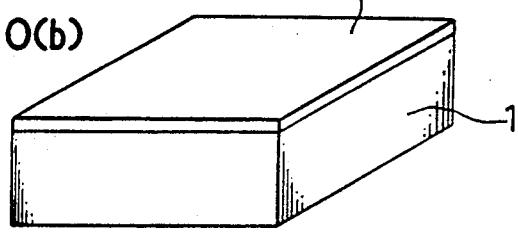
FIG. 10(b)
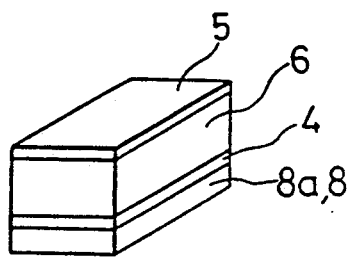
FIG. 10(c)
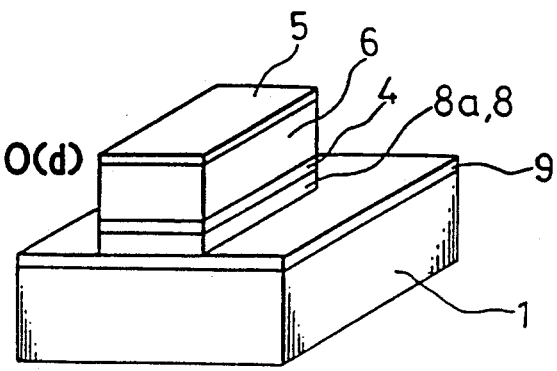
FIG. 10(d)

SEMICONDUCTOR DEVICE MOUNTED ON A HEAT SINK WITH AN INTERVENING AMORPHOUS SEMICONDUCTOR MATERIAL

FIELD OF THE INVENTION

The present invention relates to a semiconductor device with reduced resistance and increased life by reducing applied stress and a method for manufacturing the semiconductor device.

BACKGROUND OF THE INVENTION

FIG. 14 is a perspective view showing a conventional semiconductor laser device disclosed in, for example "MITSUBISHI DENKI GIHO", Vol. 60, No. 12, pp. 27 to 31, 1986. In FIG. 14, reference numeral 1 designates a heat sink formed of silver or diamond. A submount 2 formed of crystalline Si is put on the heat sink 1. Gold films 3 are formed on upper and lower surfaces of the submount 2. A semiconductor laser chip 6 is put on the submount 2. A p side electrode or an n side electrode 4 and an n side electrode or a p side electrode 5 are formed on lower and upper surfaces of the laser chip 6, respectively. Especially, the surface of the electrode 4 mounted on the submount 2 is plated with gold. A wire 7 is bonded to the electrode 5.

Next, description will be given of a method for reducing stress applied to the semiconductor laser chip in the prior art. Since the heat sink 1 is formed of metal and the laser chip 6 is formed of a semiconductor, there is a large difference between their thermal expansion coefficients. For example, when the heat sink 1 is formed of silver and the laser chip 6 is formed of GaAs, the thermal expansion coefficients of the heat sink and the laser chip are approximately $19.5 \times 10^{-6}/°C$. and $6.5 \times 10^{-6}/°C$., respectively. In general, the laser chip 6 is attached to the heat sink 1 using an appropriate soldering material at a high temperature. When the high temperature falls to room temperature (low temperature), stress is applied to the laser chip 6 because of the above-described difference in thermal expansion coefficients, with the result that laser characteristics are degraded. In order to avoid this problem, the submount 2 formed of Si is inserted between the heat sink 1 and the laser chip 6 in the prior art Since the thermal expansion coefficient of the Si is relatively close to that of GaAs and the submount 2 formed of the Si has an appropriate thickness (approximately 150 microns, the stress generated by the difference in thermal expansion coefficients is reduced because of the submount 2 so that the stress is not applied to the laser chip 6.

In addition, there is another method for reducing the stress applied to the laser chip 6, in which the laser chip 6 is bonded to the heat sink 1 using a soldering material having relatively low melting point for example InPb).

As described above, according to the conventional semiconductor laser, since Si having a thickness of approximately 150 microns is inserted between the heat sink and the laser chip as a submount, heat generated in the laser chip is poorly conducted. Therefore, that mounting is not suitable for high output and high power current injection operation.

In addition, according to the method using a soldering material having a low melting point, a wire has to be attached at a lower temperature after the soldering step so the wire is not reliably attached.

SUMMARY OF THE INVENTION

The present invention was made to solve those problems and it is an object of the present invention to provide a semiconductor device having a long life in which stress applied to a semiconductor element can be reduced and also heat generated by the semiconductor element can be reliably radiated.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

According to semiconductor device in accordance with the present invention, an amorphous semiconductor film is formed on a heat sink and a semiconductor element is mounted on the heat sink with the amorphous semiconductor film therebetween. As a result the stress, applied to the semiconductor element while the semiconductor device is constructed or operated is reduced because of the amorphous semiconductor film.

In addition, according to a semiconductor device in accordance with the present invention, an amorphous semiconductor film formed of amorphous silicon or amorphous germanium is formed on the heat sink with a first metal film therebeween and a semiconductor element is bonded onto the amorphous semiconductor film with a second metal film intervening therebetween. As a result, the stress applied to the semiconductor device while the semiconductor device is constructed or operated is reduced. Furthermore, ohmic contact is made by alloys, for example gold-silicon or gold-germanium, disposed between the amorphous semiconductor film and the first and second metal films, with the result that an electrical characteristic are improved.

In addition, a semiconductor device in accordance with the present invention comprises an amorphous semiconductor layer provided only where the semiconductor element is attached on the heat sink and a metal film having an electrical resistance lower than that of the amorphous semiconductor film and disposed on the amorphous semiconductor film and the heat sink, in which a semiconductor element is mounted on the heat sink with the amorphous semiconductor film and the metal film. As a result the stress, applied to the semiconductor element while the semiconductor device is constructed or operated is reduced because of the amorphous semiconductor film. Furthermore, since the current for driving the semiconductor element flows through the metal film, the electrical characteristics of the semiconductor device can be improved.

In addition, a semiconductor device in accordance with the present invention comprises an amorphous semiconductor film provided on the whole surface of the heat sink and a metal film formed on the amorphous semiconductor film, in which a semiconductor element is mounted on the heat sink via the amorphous semiconductor film and the metal film. As a result the stress, applied to the semiconductor element while the semiconductor device is constructed or operated is reduced because of the amorphous semiconductor film. Furthermore, since the current for driving the semiconductor element flows through the metal film and further through a lead connected to the metal film, the electrical characteristics of the semiconductor device are improved.

A method for manufacturing a semiconductor device in accordance with the present invention comprises the steps of forming a first metal film on a heat sink, forming an amorphous semiconductor film on the metal film, putting a semiconductor element on the amorphous semiconductor film and bonding the semiconductor element by applying pressure so as to push the semiconductor element to the heat sink and heating while applying pressure so that alloys are formed between the first and second metal films and the amorphous semiconductor film. As a result, a life of the semiconductor device is increased, because the stress applied to the semiconductor element is easily reduced without using a soldering material, and heat generated by the semiconductor element is reliably radiated.

In addition, a method for manufacturing a semiconductor device in accordance with the present invention comprises the steps of forming a first metal film on a heat sink, forming an amorphous semiconductor film on the metal film, forming a second metal film on the amorphous semiconductor film, putting a semiconductor element on the second metal film and bonding the semiconductor element by applying pressure so as to push the semiconductor element to the heat sink and heating while applying pressure. As a result, it is possible to manufacture a semiconductor device in which oxidation of the amorphous semiconductor film is prevented and also the electrical characteristics are improved.

BRIEF DESCRIPTION OF THE DRAWINGS

FIGS. 3(a) to 3(e) are perspective views showing manufacturing steps of the semiconductor device shown in FIG. 2(a);

FIGS. 10(a) to 10(e) are perspective views showing semiconductor steps in accordance with a fifth embodiment of the present invention;

DESCRIPTION OF THE PREFERRED EMBODIMENTS

Embodiments of the present invention will be described in detail hereinafter in reference to the drawings.

Figure 1:
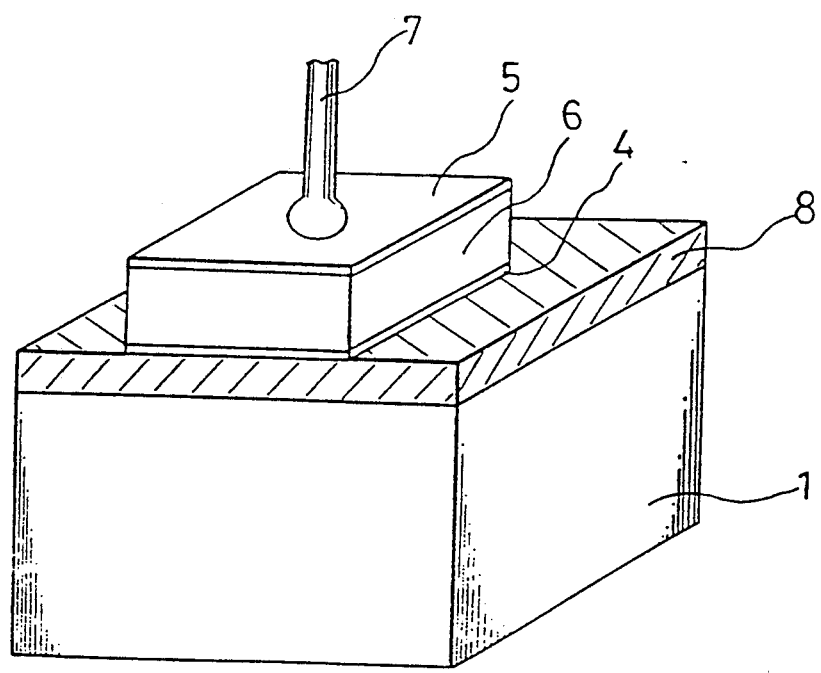
FIG. 1 is a perspective view showing a semiconductor laser as a semiconductor device in accordance with a first embodiment of the present invention.

FIG. 1 is a perspective view showing a semiconductor laser as a semiconductor device in accordance with a first embodiment of the present invention. In FIG. 1, reference numeral 1 designates a heat sink formed of, for example silver. An amorphous semiconductor film 8 is disposed on the heat sink 1 and a semiconductor laser chip 6 is mounted on the heat sink 1 with the amorphous semiconductor film 8 between the chip 6 and sink 1. Reference numeral 4 designates a p side electrode or an n side electrode of the semiconductor laser chip 6 and reference numeral 5 designates an n side electrode or p side electrode thereof. A wire 7 is bonded to the electrode 5.

Manufacturing steps of this first embodiment of the present invention will be described hereinafter.

First, the heat sink 1 formed of, for example silver or diamond is prepared. The amorphous semiconductor film 8 is formed on the heat sink 1 by electron beam evaporation or sputtering. In addition, the temperature of a substrate when the amorphous semiconductor film is formed is approximately 200° C. Then, the semiconductor laser chip 6 having the electrodes 4 and 5 formed on both surfaces thereof is fixed onto the amorphous semiconductor film 8 using an appropriate soldering material. Finally, the wire 7 is bonded to the electrode 5 of the semiconductor laser chip 6 and then the semiconductor laser shown in FIG. 1 is completed.

Next, operation of this first embodiment of the present invention will be described hereinafter.

Figure 14:
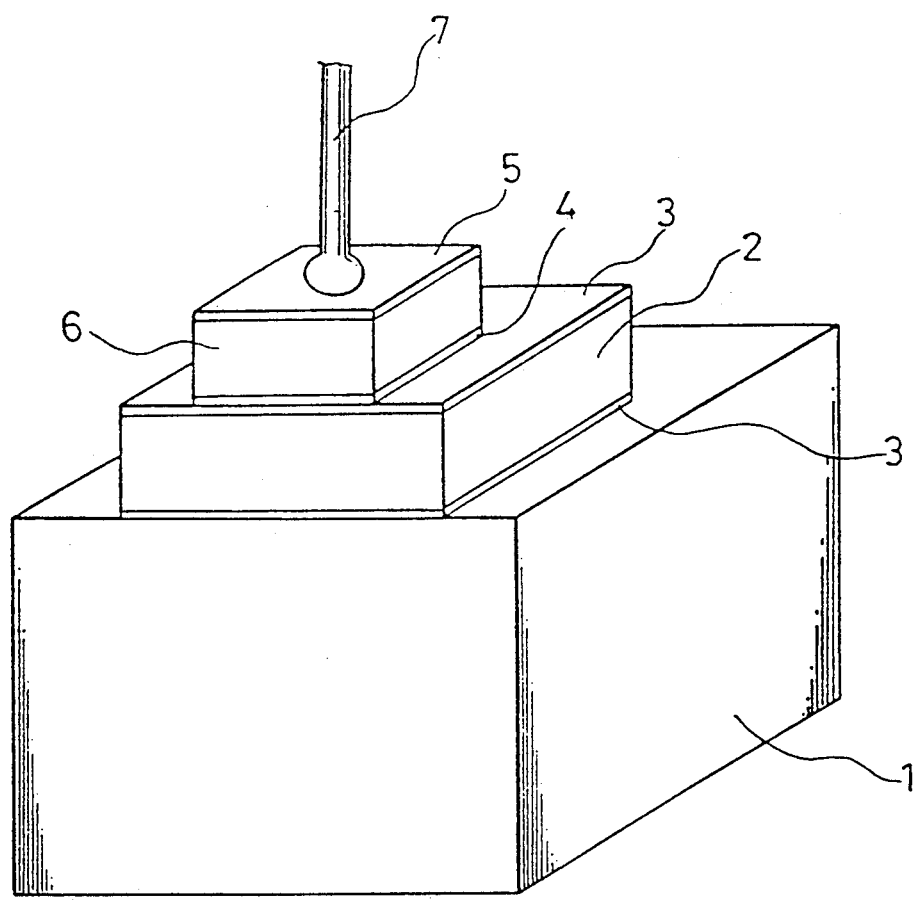
FIG. 14 is a perspective view showing a conventional semiconductor laser device.

According to the first embodiment of the present invention, the amorphous semiconductor film 8 formed of, for example amorphous silicon is inserted between the heat sink 1 and the semiconductor laser chip 6. In general, the heat sink and the semiconductor laser are bonded at a relatively high temperature of approximately 300° to 400° C. and therefore, when the temperature falls to room temperature, stress is applied to the semiconductor laser chip. Even when the semiconductor laser operates normally, heat is generated in the semiconductor laser chip. Since a thermal expansion coefficient of the semiconductor laser chip is different from that of the heat sink, stress is applied to the semiconductor laser chip even during its operation. Thus, the semiconductor laser can not operate for a long time. The amorphous semiconductor used in the first embodiment of the present invention has various lattice constants unlike the crystalline semiconductor. Therefore, stress generated by the difference between the thermal expansion coefficients of the semiconductor laser chip and the heat sink is not applied to the semiconductor laser chip but is applied to the amorphous semiconductor film in the structure shown in FIG. 1 Thus, the semiconductor laser can operate for a long time. In addition, according to a conventional example in FIG. 14, crystalline Si having a thickness of approximately 150 microns is used for reducing the stress, so that thermal resistance is relatively high. Meanwhile, the amorphous semiconductor film in accordance with the first embodiment of the present invention effectively reduces stress even if it is quite thin, e.g., approximately 3000 angstroms thick, with the result that the thermal resistance can be reduced.

Figure 2A:
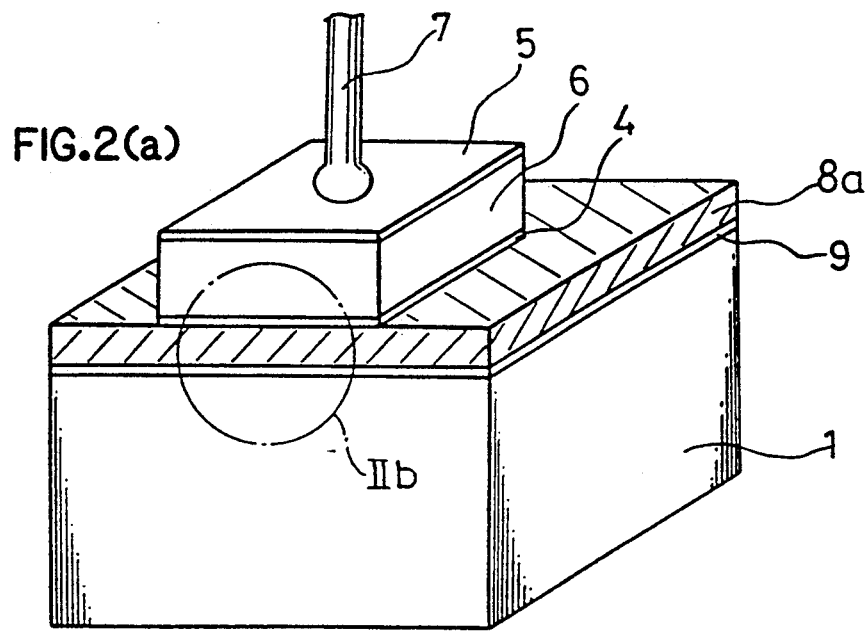
FIG. 2(a) is a perspective view and FIG. 2(b) is a detail view showing a semiconductor laser as a semiconductor device in accordance with a second embodiment of the present invention.
Figure 2B:
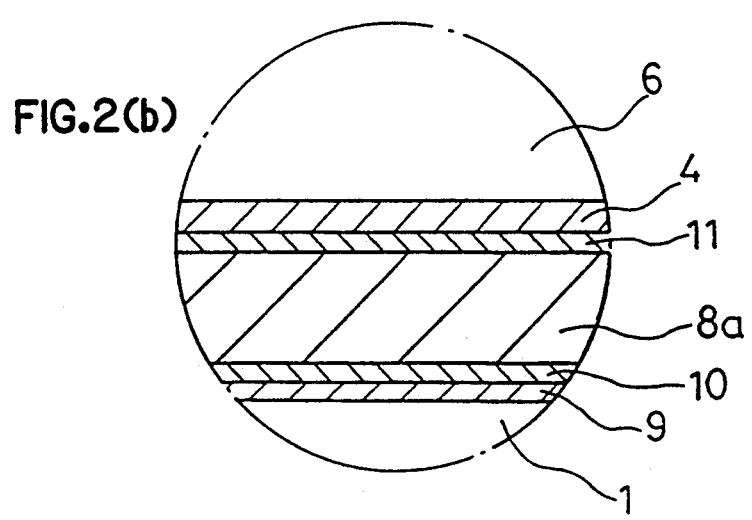

FIG. 2(a) is a perspective view showing a semiconductor laser as a semiconductor device in accordance with a second embodiment of the present invention and FIG. 2(b) is an enlarged view showing the part within the circle IIb in FIG. 2(a). In FIG. 2(a), the same references as in FIG. 1 designate the same or corresponding parts. A metal film 9 is formed on the heat sink 1 by gilding or the like and an amorphous silicon or amorphous germanium 8a is formed on the metal film 9. An alloy film 10 is formed between the amorphous silicon or amorphous germanium 8a and the metal film 9 and an alloy film 11 is formed between the amorphous silicon or amorphous germanium 8a and the p side electrode (or n side electrode) 4.

FIGS. 3(a) to 3(e) are perspective views showing manufacturing steps for the semiconductor laser device in accordance with the second embodiment of the present invention.

First, referring to FIG. 3(a), the heat sink 1 formed of, for example silver or diamond is prepared. Then, referring to FIG. 3(b), the metal film 9 is formed on the heat sink 1 by gilding or the like. Then, referring to FIG. 3(c), the amorphous semiconductor film 8a formed of amorphous silicon or amorphous germanium is formed on the metal film 9 by electron beam evaporation or sputtering. The temperature of a substrate when the amorphous semiconductor film is formed is approximately 200° C. Then, referring to FIG. 3(d), the semiconductor laser chip 6 having the electrodes 5 and 4 formed on opposed upper and lower surfaces thereof, respectively, is put on the amorphous semiconductor film 8a and heated, while pressure or weight is applied. Then, the alloy films are formed between the amorphous semiconductor film 8a and the metal film 9 and the electrode 4, whereby the laser chip 6 is fixed onto the amorphous semiconductor film 8a without using a soldering material. Finally, referring to FIG. 3(e), the wire 7 is bonded to the electrode 5 of the semiconductor laser chip 6 and then the semiconductor laser is completed.

Next, operation in accordance with this embodiment of the present invention will be described hereinafter.

According to the second embodiment of the present invention, the amorphous semiconductor film 8a formed of amorphous silicon or amorphous germanium is inserted between the semiconductor laser chip 6 and the heat sink 1 and the metal film 9 is provided on the heat sink. When the amorphous semiconductor film formed of amorphous silicon or amorphous germanium and the metal film are bonded and heated, the alloy film 10 is formed at the bonding region. Similarly, the alloy film 11 is formed between the electrode 4 of the semiconductor laser and the amorphous semiconductor film formed of amorphous silicon or amorphous germanium. As a result, the same effect as in the first embodiment can be attained and sufficient structural strength can be obtained without using the soldering material, so that the construction work is simple. Furthermore, since ohmic contact is made by these alloy films, the electrical characteristics are improved.

Figure 6A:
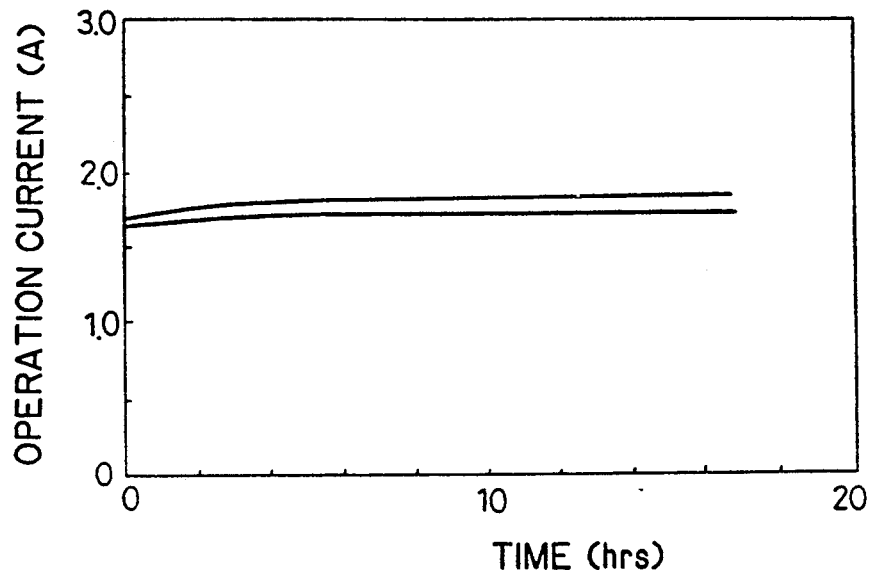
FIG. 6(a) is a graph showing an operational current which varies with time when light is constantly output (1W, 25° C.) from the semiconductor device in FIG. 2.
Figure 6B:
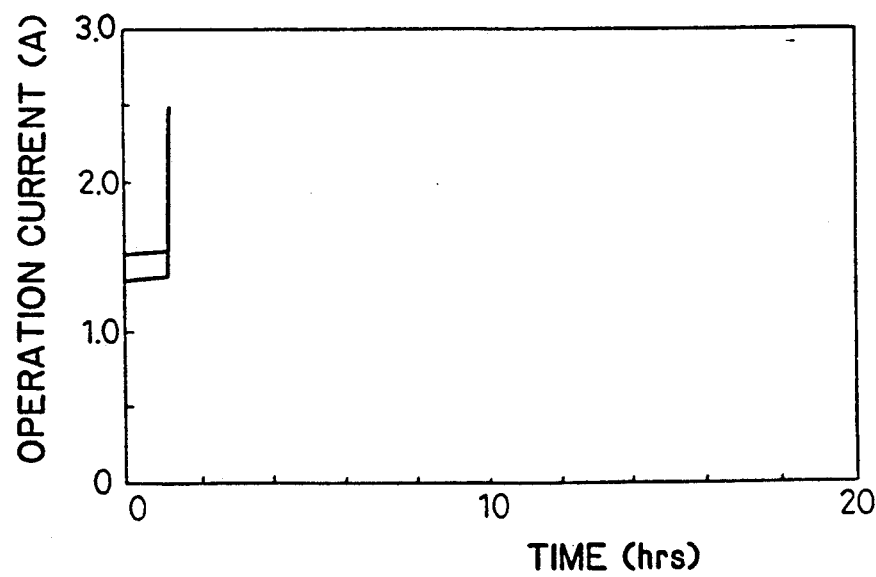
FIG. 6(b) is a graph showing an operational current which varies with time when light is constantly output (1W, 25° C.) from a semiconductor laser in which a semiconductor laser chip is directly bonded to a heat sink with gold-silicon solder.

FIGS. 6(a) and 6(b) describe the effectiveness of the present invention. FIG. 6(a) shows a result of an operational test of the semiconductor laser device when amorphous silicon having a thickness of approximately 3000 angstroms, silver, and gold film are used as the amorphous semiconductor film, the heat sink, and the metal film, respectively when the ambient temperature is 25° C. and optical power output is 1W. FIG. 6(b) shows an example of laser performance when the silver heat sink is directly bonded to the semiconductor laser chip using a gold-silicon soldering material and operated under the same conditions as in FIG. 6(a) for comparison. As can be seen from the figure, in case of direct bonding, all elements are degraded within two hours because of the stress applied to the semiconductor laser chip. On the other hand, according to the present invention, stable operation can be continuously obtained for a long time. In addition, in a conventional case using Si having a thickness of 150 microns, the optical output does not satisfy the operational condition because the thermal resistance is too high.

Figure 4:
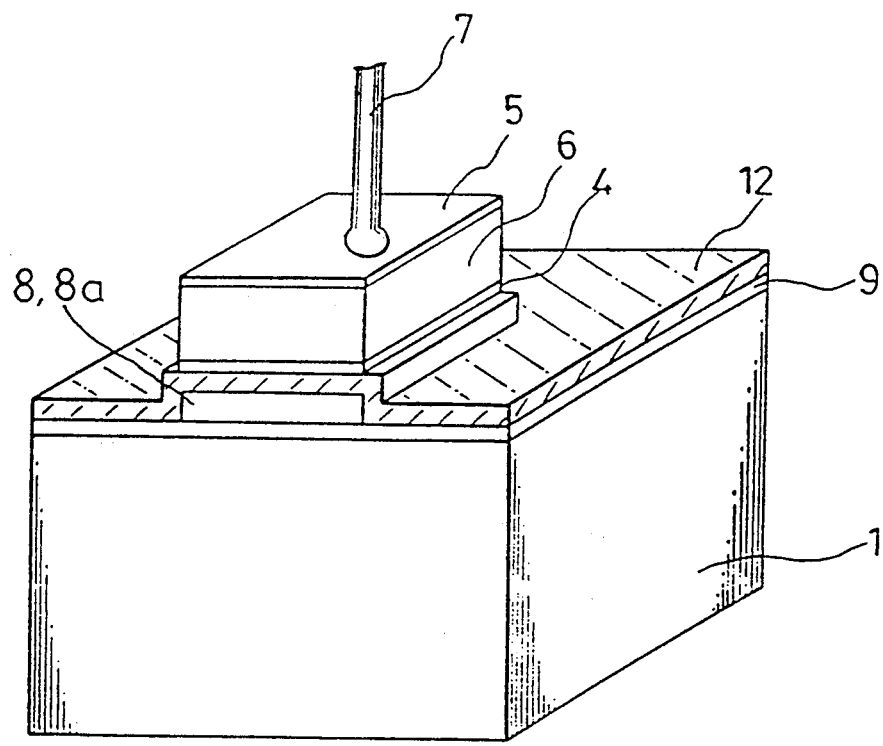
FIG. 4 is a perspective view showing a semiconductor laser as a semiconductor device in accordance with a third embodiment of the present invention.

FIG. 4 is a perspective view showing a semiconductor laser as a semiconductor device in accordance with a third embodiment of the present invention. In FIG. 4, the same references as in FIGS. 1 and 2(a) designate the same or corresponding parts Reference numeral 12 designates an electrically conductive metal film provided on the amorphous semiconductor film 8 or 8a and the metal film 9.

FIGS. 5(a) to 5(f) are perspective views showing manufacturing steps of the semiconductor laser in accordance with the third embodiment of the present invention.

The manufacturing steps of the semiconductor laser in accordance with the third embodiment of the present invention are described hereinafter.

Figure 5A:
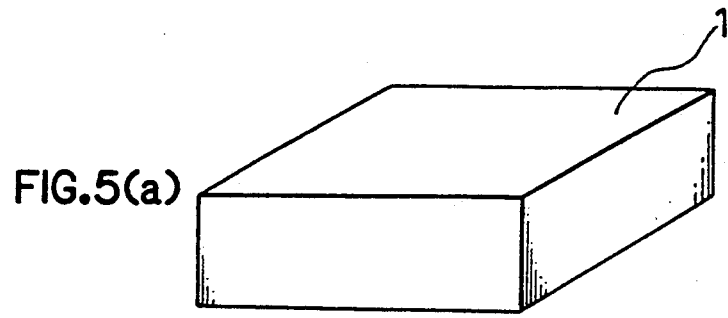
FIGS. 5(a) to 5(f) are perspective views showing manufacturing steps of the semiconductor device shown in FIG. 4.
Figure 5B:
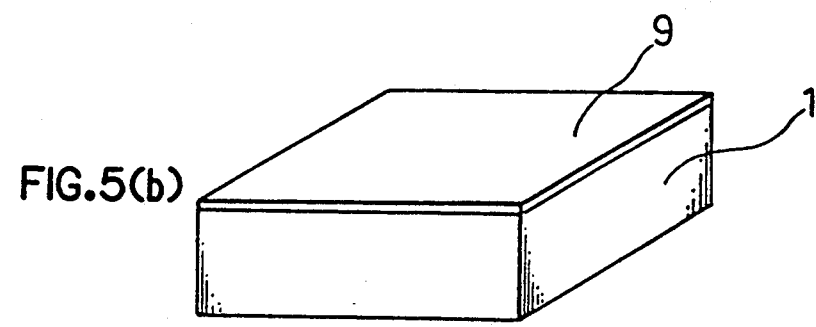
Figure 5C:
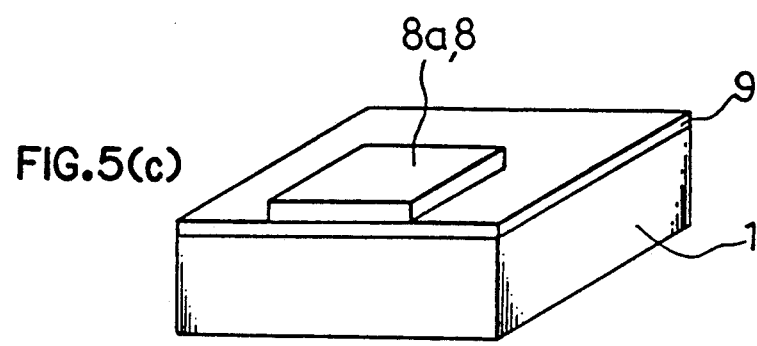

Referring to FIG. 5(a), the heat sink 1 formed of, for example silver or diamond is prepared. Then, referring to FIG. 5(b), the metal film 9 is formed on the heat sink 1 by, for example, gilding or the like. Then, the amorphous semiconductor film is formed by electron beam evaporation or sputtering. Similar to the first and second embodiments of the present invention, when the amorphous semiconductor film is formed, the temperature of the substrate is approximately 200° C. Then, the amorphous semiconductor film 8 or 8a is formed so as to be about the same size as that of the semiconductor laser chip by etching as shown in FIG. 5(c). The amorphous semiconductor film can be formed also by a lift-off method rather than the above-described etching. According to this method, an oxide film or the like is formed on a part of the metal film 9 where the amorphous semiconductor film 8 or 8a is not to be formed before the amorphous semiconductor film is formed on the metal film 9. Then the amorphous semiconductor film is formed on the metal film 9 including on the oxide film or the like by the same method as above. An unnecessary part of the amorphous semiconductor film is removed by removing the oxide film or the like.

Figure 5D:
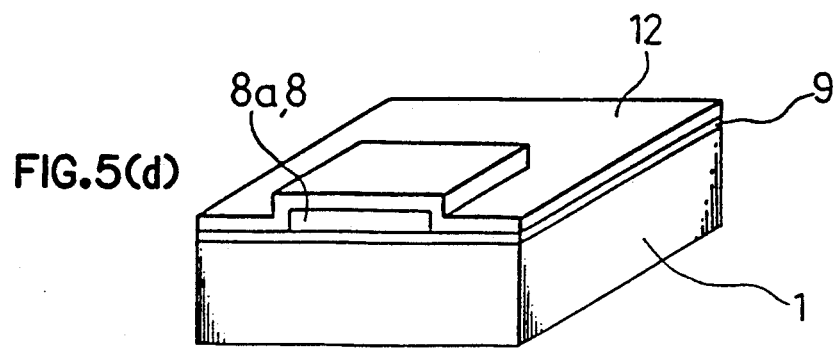
Figure 5E:
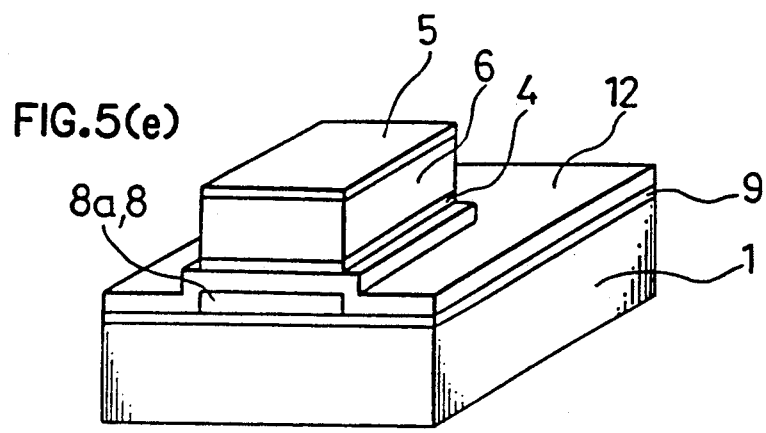
Figure 5F:
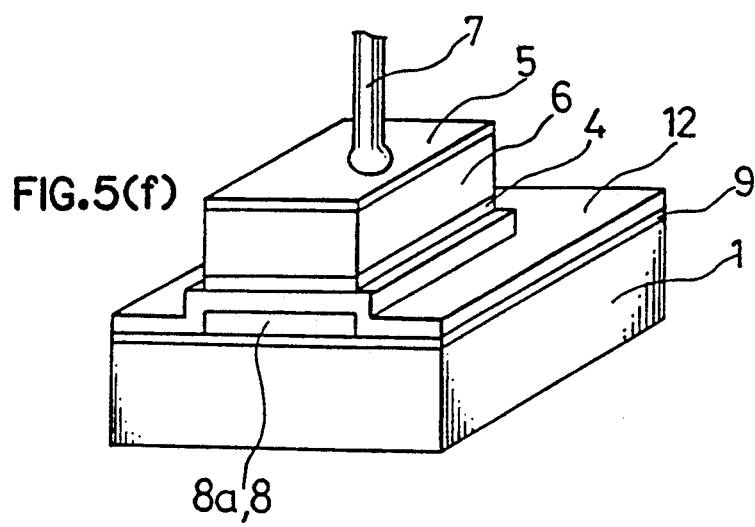

Then, referring to FIG. 5(d), the electrically conductive metal film 12 is formed on the amorphous semiconductor film 8 or 8a and the metal film 9 by resistive heating evaporation, electron beam evaporation, sputtering or gilding. Then, referring to FIG. 5(e), the semiconductor laser chip 6 having the electrodes 5 and 4 formed on upper and bottom surfaces thereof, respectively, is put on the electrically conductive metal film 12 on the amorphous semiconductor film 8 or 8a with an appropriate soldering material and then the whole element is heated up, while pressure is applied from above. Thus, the semiconductor laser chip 6 is fixed onto the metal film 12 and in a case where the amorphous semiconductor film 8a is formed of amorphous silicon or amorphous germanium, alloy films are formed between the amorphous semiconductor film, the metal film 9 and the electrically conductive metal film 12. Finally, referring to FIG. 5(f), the gold wire 7 is bonded to the electrode 5 of the semiconductor laser chip 6 and then the semiconductor laser shown in FIG. 4 is completed.

Then, operation thereof in accordance with the third embodiment of the present invention will be described hereinafter.

According to the third embodiment of the present invention, the electrically conductive metal film 12 is provided in order to divide a part where current mainly flows from a part where heat mainly flows. In addition, since the amorphous semiconductor film is arranged only under the semiconductor laser and in the vicinity thereof, the semiconductor laser chip is prevented from receiving stress. Although the heat mainly flows through the amorphous semiconductor film, the amorphous semiconductor film has a thickness of approximately 3000 angstroms as described above, so that thermal resistance is not increased. On the other hand, since the electrically conductive metal film 12 and the metal film 9 have fairly high electric conductivity as compared with the amorphous semiconductor film, the current flows through the metal films 9 and 12, so that the electrical characteristics are good. In addition, the metal film 9 is not always necessary in this embodiment.

Figure 7:
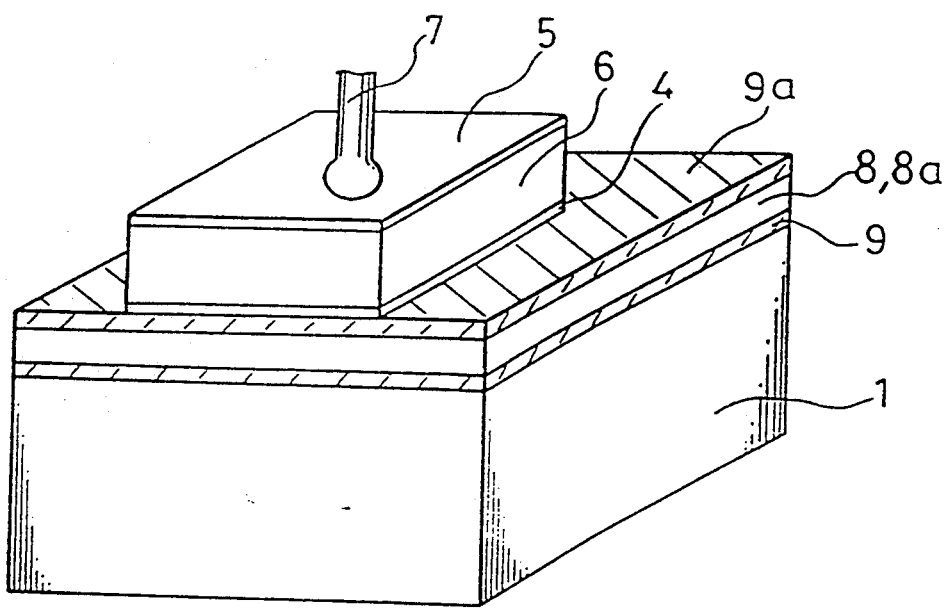
FIG. 7 is a perspective view showing a semiconductor laser as a semiconductor device in accordance with a fourth embodiment of the present invention.
Figure 8:
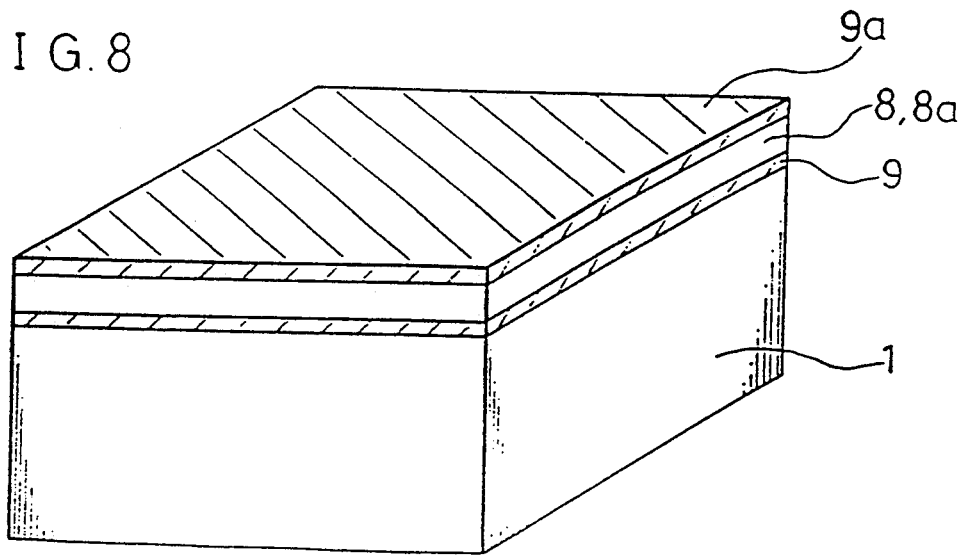
FIG. 8 is a view showing a manufacturing step of the semiconductor device shown in FIG. 7.
Figure 9:
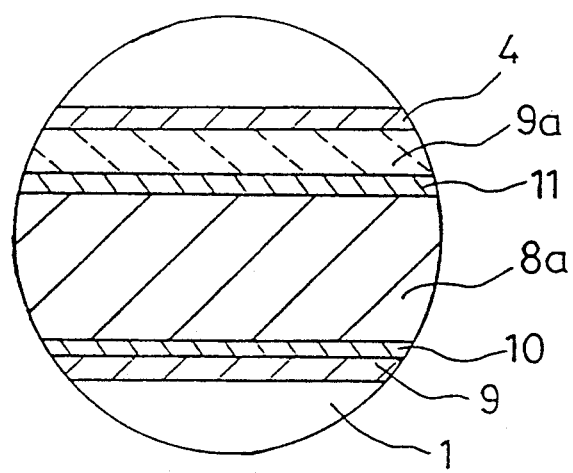
FIG. 9 is an enlarged view showing the chip of the semiconductor device in FIG. 7 attached to a mount.

FIG. 7 is a perspective view showing a semiconductor laser as a semiconductor device in accordance with a fourth embodiment of the present invention. Reference numeral 9a designates metal film provided on the amorphous semiconductor film. According to manufacturing steps of the semiconductor device in accordance with the fourth embodiment of the present invention, as shown in FIG. 8, the metal film 9, the amorphous semiconductor film 8 or 8a and the metal film 9a are formed on the heat sink 1 and then they are heated up once. Because of the metal film 9a, the amorphous semiconductor film is not oxidized at all. When the amorphous semiconductor film 8a is formed of amorphous silicon or amorphous germanium, alloy films are surely formed between the amorphous semiconductor film and the metal films 9 and 9a as shown in FIG. 9, which serves as ohmic contact. As a result, the electrical characteristic are improved.

FIGS. 10(a)-10(e) are views showing a semiconductor laser as a semiconductor device and its manufacturing steps in accordance with a fifth embodiment of the present invention. According to the fifth embodiment of the present invention, the amorphous semiconductor film 8 or 8a is attached to the semiconductor laser chip during the manufacturing steps.

Each manufacturing step thereof will be described hereinafter. First, referring to FIG. 10(a), the heat sink 1 is prepared. Then, referring to FIG. 10(b), the metal film 9 is formed on the heat sink 1. Then, referring to FIG. 10(c), the amorphous semiconductor film 8 (8a) is attached to a bottom surface of the semiconductor laser chip 6 having the electrodes 5 and 4 previously formed on upper and bottom surfaces thereof by electron beam evaporation or sputtering. Then, referring to FIG. 10(d), the semiconductor laser chip formed as shown in FIG. 10(c) is put on the metal film 9 and then pressure or weight is applied from above, while the whole is heated up. Thus, in the case where the amorphous semiconductor film is formed of amorphous silicon or amorphous germanium, alloy films are formed between the amorphous semiconductor film, the metal film 9 and the electrode 4, whereby the semiconductor laser chip is fixed onto the metal film 9. When an amorphous semiconductor film, on which an alloy metal film is not likely to be formed, is used, the laser chip can be fixed using an appropriate soldering material. Finally, referring to FIG. 10(e), the wire 7 is bonded to the electrode 5 of the semiconductor laser chip and then the laser is completed.

According to the fifth embodiment of the present invention, strain caused by a difference between the thermal expansion coefficients of the heat sink 1 and the semiconductor laser chip 6 is reduced due to the amorphous semiconductor film 8 or 8a. Even when the amorphous semiconductor film is very thin, it has an effect of reducing the strain, with the result that thermal resistance is not increased and the life of a laser element is increased. Furthermore, since the alloy film is formed between the amorphous semiconductor film and the metal film, the electrical characteristics are improved.

Figure 11:
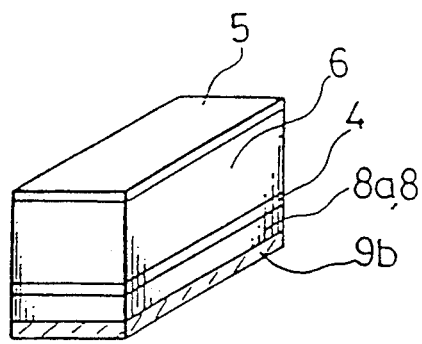
FIG. 11 is a view showing a laser chip before it is attached onto the heat sink of a semiconductor laser as a semiconductor device in accordance with a sixth embodiment of the present invention.

FIG. 11 is a view showing a laser chip of a semiconductor laser as a semiconductor device in accordance with a sixth embodiment of the present invention before it is attached to the heat sink. According to the sixth embodiment of the present invention, a metal film 9b is further formed just after the amorphous semiconductor film is formed on the semiconductor laser chip at the step shown in FIG. 10(c) in the fifth embodiment of the present invention. As a result, oxidation of a surface of the amorphous semiconductor film before it is fixed to the laser chip is prevented and then a semiconductor laser device having high thermal conductivity and electrical conductivity is obtained.

Figure 12:
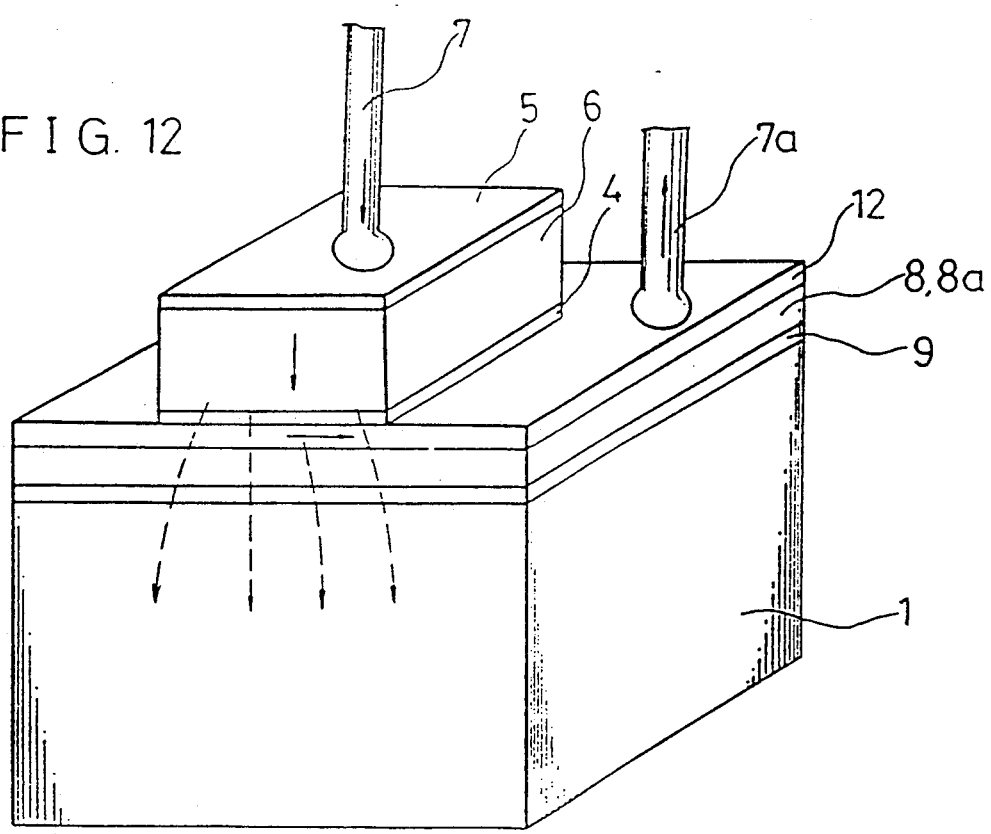
FIG. 12 is a perspective view showing a semiconductor laser as a semiconductor device in accordance with a seventh embodiment of the present invention.
Figure 13A:
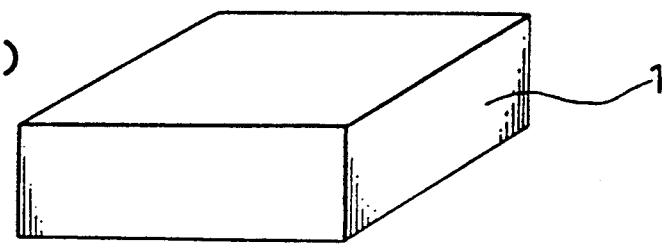
FIGS. 13(a) to 13(f) are perspective views showing manufacturing steps of the semiconductor device shown in FIG. 12.
Figure 13B:
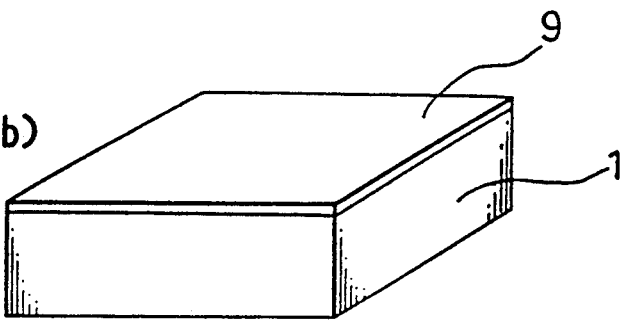
Figure 13C:
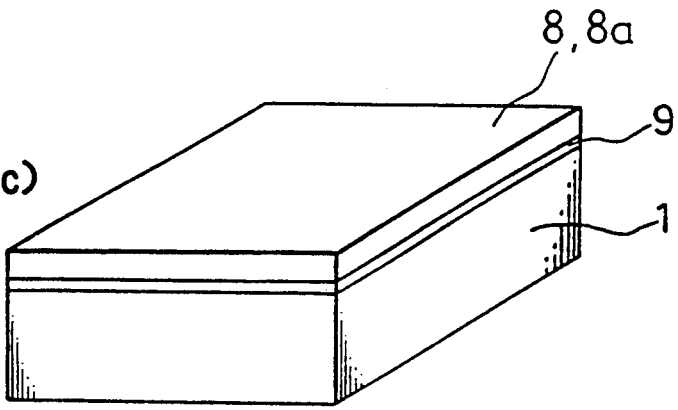
Figure 13D:
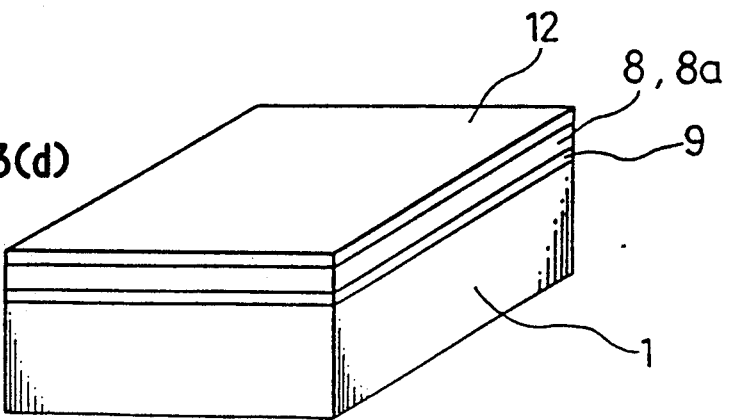
Figure 13E:
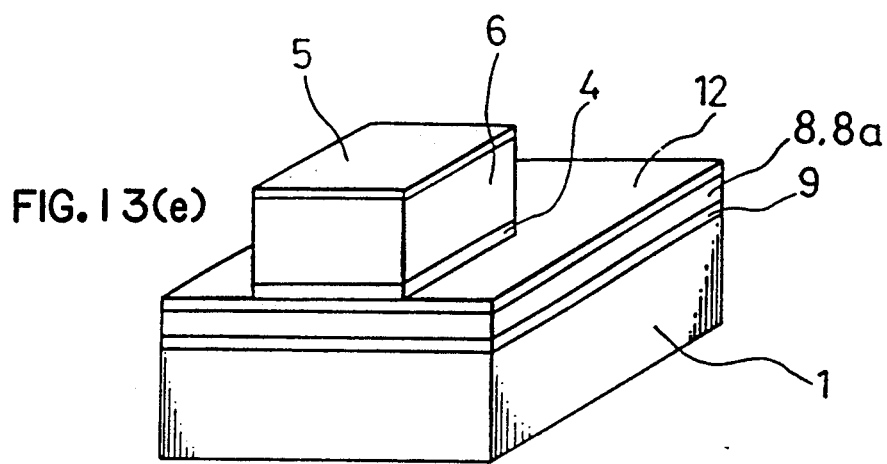
Figure 13F:
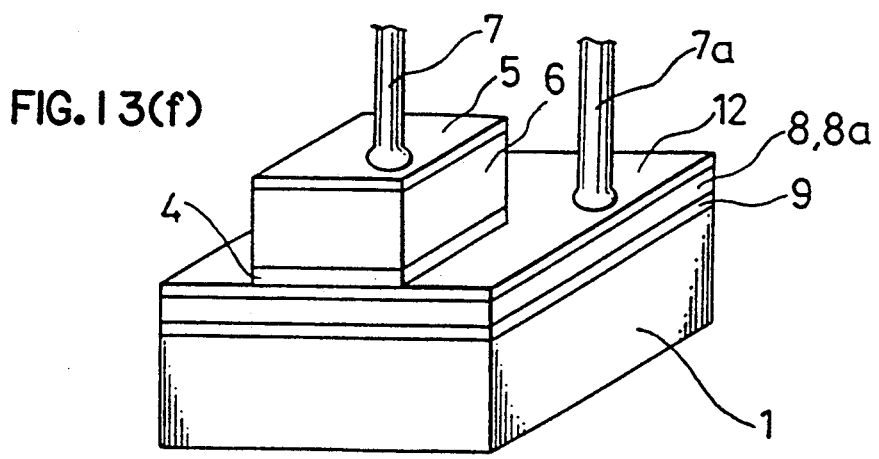

FIG. 12 is a perspective view showing a semiconductor laser as a semiconductor device in accordance with a seventh embodiment of the present invention. According to the seventh embodiment of the present invention, the electrically conductive metal film 12 is formed on the whole surface of the amorphous semiconductor film and then a gold wire 7a is bonded to the metal film 12 to completely separate current flow from heat flow. An electrical current flows as shown by an arrow of a solid line and heat flows as shown by an arrow of a dotted line. As a result, no influence of the amorphous semiconductor film is exerted on the electrical conductivity.

FIGS. 13(a) to 13(f) are perspective views showing manufacturing steps for the semiconductor laser in accordance with a seventh embodiment of the present invention. Each step is described hereinafter in reference to the figure. First, referring to FIG. 13(a), the heat sink 1 is prepared. Then, referring to FIG. 13(b), the metal film 9 is formed on the heat sink 1. Then, referring to FIG. 13(c), the amorphous semiconductor film 8 or 8a is formed by electron beam evaporation or sputtering. When the amorphous semiconductor film 8 or 8a is formed, the temperature of a substrate is approximately 200° C. Then, referring to FIG. 13(d), the electrically conductive metal film 12 is formed on the whole surface of the amorphous semiconductor film 8 or 8a by resistive heating evaporation, electron beam evaporation or sputtering. The films can be heated up once in this state to form the alloy films between the amorphous semiconductor film 8 or 8a and the metal films 9 and 12. Thereafter, referring to FIG. 13(e), the semiconductor laser chip 6 having the electrodes 5 and 4 previously formed on upper and bottom surfaces thereof, respectively, is put on the electrically conductive metal film 12. Then, pressure or weight is applied from above, while the whole is heated up, so that the laser chip is fixed onto the metal film 12. If there was no heat treatment at the previous step, that is, the step shown in FIG. 13(d), the alloy films are formed between the amorphous semiconductor film 8 or 8a and the metal films 9 and 12 at the step shown in FIG. 13(e). Finally, referring to FIG. 13(f), the gold wires 7 and 7a are bonded to the electrode 5 of the semiconductor laser chip and the electrically conductive metal film 12. Thus, the semiconductor laser shown in FIG. 12 is completed.

Although a description was given of the semiconductor laser device in the above embodiments, the present invention is not limited thereto. The same effect can be obtained even when the present invention is applied to any semiconductor device in which the semiconductor element is arranged on the heat sink and stress is generated when it is constructed or the element operates.

According to the present invention, since the amorphous semiconductor film is inserted between the semiconductor element and the heat sink, stress applied to the semiconductor element is reduced and also the thermal resistance of the whole semiconductor device is reduced, with the result that the life of the semiconductor device is increased.

In addition, according to the present invention, since the amorphous semiconductor film is formed of amorphous silicon or amorphous germanium, the stress applied to the semiconductor element is reduced and also an ohmic contact is formed by alloys formed between the amorphous semiconductor film and the metal film, with the result that semiconductor device having high bonding strength and electrical conductivity can be obtained.

In addition, according to the present invention, the semiconductor device comprises the amorphous semiconductor film provided only where the semiconductor element is arranged on the heat sink and the metal film having electrical resistance lower than that of the amorphous semiconductor film and formed on the amorphous semiconductor film and the heat sink, in which the semiconductor element is put on the heat sink with the amorphous semiconductor film and the metal film intervening. As a result, the path through which the electrical current flows is separated from the path through which heat flows, so that stress applied to the semiconductor element is reduced and the thermal resistance thereof is also reduced. Furthermore, electrical conductivity of the semiconductor device is high.

In addition, according to the present invention, the semiconductor device comprises the amorphous semiconductor film provided on the whole surface of the heat sink and the metal film formed on the amorphous semiconductor film, in which the semiconductor element is put on the heat sink with the amorphous semiconductor film intervening and the metal film and the metal film is connected to the lead for supplying current to drive the element. As a result, the path through which electrical current flows is separated from the path through which heat flows, so that stress applied to the semiconductor element is reduced and the thermal resistance thereof can be also reduced. Furthermore, electric conductivity of the semiconductor device can be high.

In addition, according to the present invention, the first metal film is formed on the heat sink, the amorphous semiconductor film is formed on the metal film, the semiconductor element is put on the amorphous semiconductor film with the second metal film intervening, pressure is applied so as to push the semiconductor element toward the heat sink while the whole is heated up and then alloys are formed between the first and second metal films and the amorphous semiconductor film, so that the semiconductor element is bonded. As a result, sintering and bonding are performed at one time, whereby manufacturing steps can be simplified and also the semiconductor device has high reliability.

In addition, according to the present invention, the first metal film is formed on the heat sink, the amorphous semiconductor film is formed on the metal film, the second metal film is formed on the amorphous semiconductor film, the semiconductor element is put on the second metal film and then pressure is applied so as to push the semiconductor element toward the heat sink while the whole is heated up, whereby the semiconductor element is bonded. As a result, a semiconductor device having good electrical characteristic, in which oxidation of the amorphous semiconductor film is prevented, is obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor element that generates heat during operation;
   a heat sink for radiating heat generated by said semiconductor element; and
   an amorphous semiconductor film approximately 3,000 Angstroms thick disposed on said heat sink wherein said semiconductor element is mounted on said heat sink with said amorphous semiconductor film disposed between said semiconductor element and said heat sink.

2. A semiconductor device comprising:
   a semiconductor element that generates heat during operation;
   a heat sink for radiating heat generated by said semiconductor element;
   a first metal film disposed on said heat sink;
   an amorphous semiconductor film consisting of one of amorphous silicon and amorphous germanium disposed on said first metal film; and
   a second metal film disposed on said amorphous semiconductor film wherein said semiconductor element is bonded to said second metal film and said amorphous semiconductor film is in ohmic contact with said first metal film and with said second metal film.

3. A semiconductor device in accordance with claim 2 wherein said amorphous semiconductor film is sufficiently thin so that the heat generated by said semiconductor element is effectively transferred to said heat sink.

4. A semiconductor device in accordance with claim 3 wherein the thickness of said amorphous semiconductor film is approximately 3000 angstroms.

5. A semiconductor device in accordance with claim 2 including alloy films disposed at the boundary between said amorphous semiconductor layer and said first metal film and at the boundary between said amorphous semiconductor film and said second metal film.

6. A semiconductor device in accordance with claim 5 wherein said second metal film is a gold gilding film.

7. A semiconductor device in accordance with claim 5 including an electrode disposed on said semiconductor element wherein said second metal film is a gold film disposed on said electrode and in contact with said amorphous semiconductor film.

8. A semiconductor device comprising:
a semiconductor element that generates heat during operation;
a heat sink for radiating heat generated by said semiconductor element, said semiconductor element being mounted on part of said heat sink;
an amorphous semiconductor film having an electrical resistance and disposed on said heat sink only between said semiconductor element and said heat sink; and
a metal film having an electrical resistance lower than the electrical resistance of said amorphous semiconductor film and disposed between said amorphous semiconductor film and said semiconductor element and on said heat sink.

9. A semiconductor device in accordance with claim 8 wherein said amorphous semiconductor film is sufficiently thin so that the heat generated by said semiconductor element is effectively transferred to said heat sink.

10. A semiconductor device in accordance with claim 9 wherein a thickness of said amorphous semiconductor film is approximately 3000 angstroms.

11. A semiconductor device in accordance with claim 8 wherein said metal film is a gold film.

12. A semiconductor device comprising:
a semiconductor element that generates heat during operation;
a heat sink for radiating heat generated by said semiconductor element;
an amorphous semiconductor film disposed on said heat sink; and
a metal film disposed on said amorphous semiconductor film wherein said semiconductor element is mounted on said heat sink with said amorphous semiconductor film and said metal film between said semiconductor element and said heat sink.

13. A semiconductor device in accordance with claim 12 wherein said amorphous semiconductor film is sufficiently thin so that the heat generated by said semiconductor element is effectively transferred to said heat sink.

14. A semiconductor device in accordance with claim 13 wherein the thickness of said amorphous semiconductor film is approximately 3000 angstroms.

15. A semiconductor device in accordance with claim 12 including wires for supplying a current to said semiconductor element wherein one of said wires is directly bonded to said metal film.

16. A semiconductor device in accordance with claim 12 wherein said metal film is a gold film.

* * * * *